(12) United States Patent
Jones et al.

(10) Patent No.: US 6,344,232 B1
(45) Date of Patent: Feb. 5, 2002

(54) COMPUTER CONTROLLED TEMPERATURE AND OXYGEN MAINTENANCE FOR FIBER COATING CVD

(75) Inventors: John G. Jones, Dayton; Paul D. Jero, Yellow Springs, both of OH (US)

(73) Assignee: The United States of America as represented by the Secretary of the Air Force, Washington, DC (US)

( * ) Notice: Subject to any disclaimer, the term of this patent is extended or adjusted under 35 U.S.C. 154(b) by 0 days.

(21) Appl. No.: 09/363,586

(22) Filed: Jul. 29, 1999

Related U.S. Application Data

(60) Provisional application No. 60/094,672, filed on Jul. 30, 1998.

(51) Int. Cl.[7] .................................................. C23C 16/00
(52) U.S. Cl. ................. 427/8; 427/255.24; 427/255.28; 427/255.5
(58) Field of Search ............................... 427/8, 255.24, 427/255.28, 255.395, 255.5, 294, 314, 372.2, 376.2

(56) References Cited

U.S. PATENT DOCUMENTS

| | | | |
|---|---|---|---|
| 4,863,760 A | * 9/1989 | Schantz et al. | 427/163 |
| 5,227,199 A | 7/1993 | Hazlebeck et al. | 427/376.2 |
| 5,550,636 A | 8/1996 | Hagans et al. | 356/437 |
| 5,871,805 A | * 2/1999 | Lemelson | 427/8 |

* cited by examiner

Primary Examiner—Michael Barr
(74) Attorney, Agent, or Firm—Gina S. Tollefson; Gerald B. Hollins; Thomas L. Kundert (57) ABSTRACT

Computer controlled fiber coating chemical vapor deposition system and method for generating substantially uniform coated fibers by maintaining chemical vapor deposition reactor temperature in real time. Reactor temperature is monitored by in situ temperature sensors. Reactor temperature is sensitive to oxygen levels and oxygen levels within the reactor are varied in response to temperature sensor data. Closed loop process control software maintains reactor temperature at a preselected value resulting in predictable fiber coatings of a preselected thickness, crystallinity and chemistry.

1 Claim, 9 Drawing Sheets

COMPUTER CONTROLLED TEMPERATURE AND OXYGEN MAINTENANCE FOR FIBER COATING CVD

CROSS-REFERENCE TO RELATED APPLICATIONS

This application claims priority under 35 U.S.C. § 119(e) from U.S. Provisional Application No. 60/094,672, filed Jul. 30, 1998.

RIGHTS OF THE GOVERNMENT

The invention described herein may be manufactured and used by or for the government of the United States for all governmental purposes without the payment of any royalty.

BACKGROUND OF THE INVENTION

The present invention relates generally to fiber coating chemical vapor deposition systems and methods and more particularly to a system for controlling coating composition deposited by fiber coating chemical vapor deposition.

Most ceramic matrix composites (CMCs) require a fiber interface coating in order to exhibit the desirable properties that make them potentially useful high-temperature structural materials. Although interface coatings are widely recognized as a key to these properties, fiber-coating technology has received relatively little attention, hindering successful application of CMCs. In today's search for new high-temperature structural materials and oxidation-resistant interfaces, the inability to deposit coatings of controlled chemistry, thickness, and morphology is a significant problem.

Chemical vapor deposition (CVD) is a well-known process, used commercially to deposit coatings, thin films and bulk materials for a variety of industrial applications. CVD is herein considered to apply a thin-film interface coating to a ceramic fiber for the production of ceramic matrix composites. Traditionally, CVD fiber coating has been hampered by problems such as poor coating uniformity, thickness, and chemistry control. The present invention helps to solve these problems in the art by providing a method and device for computer control of the coating process.

Figure 1:
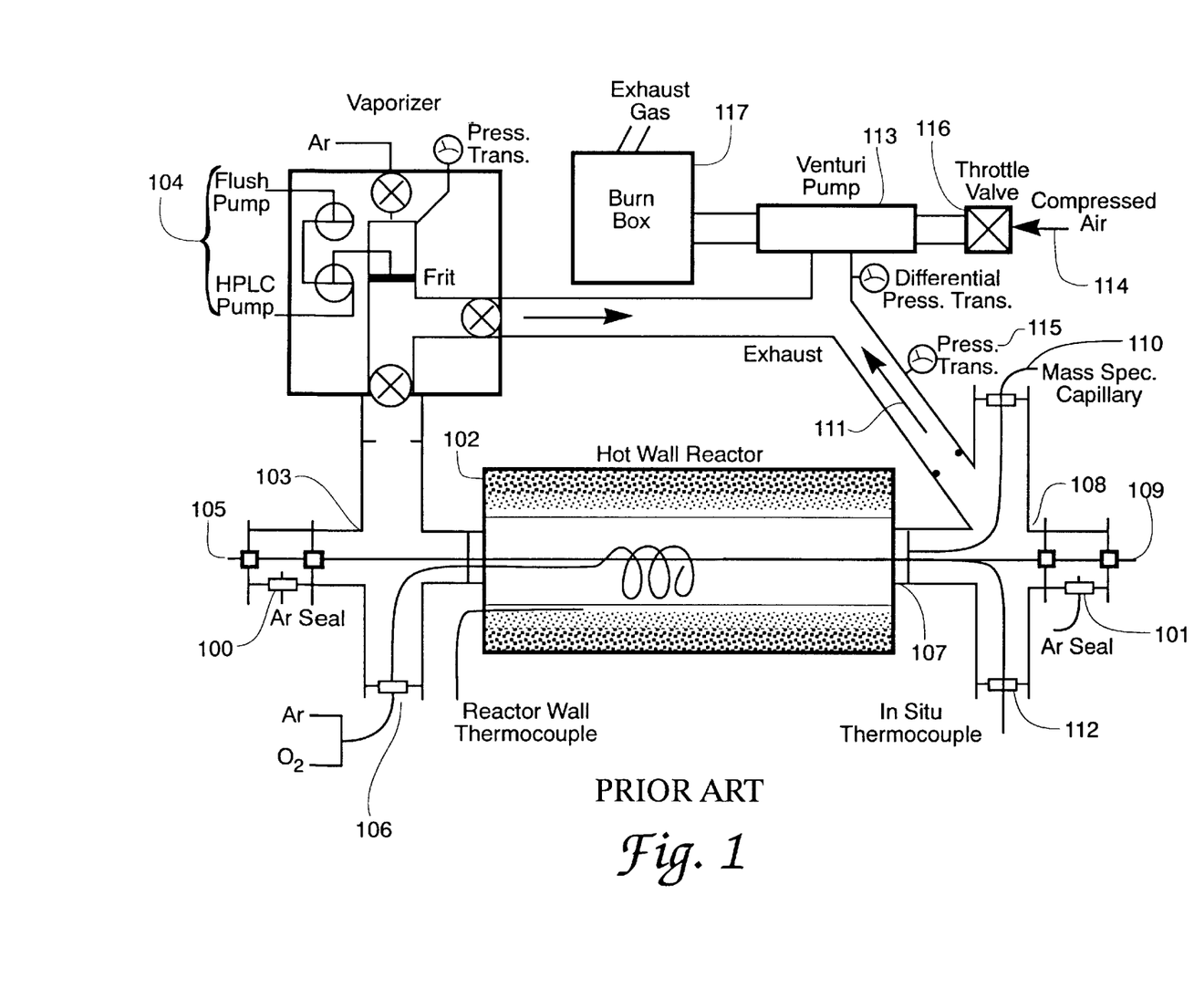
FIG. 1 shows a prior art hot wall chemical vapor deposition reactor system.

A prior art hot wall CVD reactor system capable of coating fiber in a continuos manner is shown in FIG. 1. The hot wall CVD system of FIG. 1 consists of a hot-walled reactor 102 consisting of a 2.54 cm diameter quartz tube ~30 cm in length which can be heated to 1200° C. At the front of the reactor 102 a 4-way stainless steel cross 103 connects the reactor 102 to the vaporizer 104, inlet seal 105, and the process gas inlet 106. The stainless steel cross 103, inlet seal 105, and process gases, inlet at 106, are all heated to inhibit condensation of the vaporized precursor. At the exit of the reactor 107, a 5-way heated cross 108 is used to connect the reactor 102 to the outlet seal 109, mass spectrometer capillary tube 110 and reactor exhaust 111. The 1 m long capillary tube 110, which connects the reactor exhaust gas to the mass spectrometer, is also heated.

The CVD reactor system of FIG. 1 is prepared to operate by flushing solvent and an inert gas, such as Argon, from the liquid delivery pump system, through the piping system 103 and through the hot wall reactor 102 and by using a flush pump to pump an alcohol, such as ethanol, through the vaporizer 104. The solvent performs a combination of functions including purging the vaporizer capillary tube and purging the system of unwanted elements to prepare it for passage of the precursor material to be deposited. A slight pressure differential of approximately one torr is maintained by the venturi pump 113 between the liquid delivery pump system at 104 and the piping receiving the exhaust gas shown at 111 which produces flow through the hot wall reactor 102. The metal-organic precursor material is then deposited on the fiber in the hot-wall reactor 102. The effluent flows through a burn box 117 heated to >500° C. before exiting into the hood. This ensures that any residual hydrocarbons are fully oxidized. The effluent is diluted with compressed air in the venturi pump 113; thus excess oxygen is always available.

The present invention helps solve problems in the chemical vapor deposition fiber coating art of poor coating uniformity, thickness, and chemistry control. The device and method of the invention allows an operator to employ a CVD system as shown in FIG. 1 while measuring exhaust gas composition in real time during the coating deposition. The present invention provides the capability to (1) automate the CVD fiber coating process via computer control/logging of all measurable parameters; (2) implement in situ sensors so as to measure coating or gas phase properties in real time; and (3) implement close-loop process control based on the sensor data, to produce coatings with improved composition and desired thickness. The consistency and repeatability of fiber coating, made possible by the insitu control of CVD of the present invention, makes CVD a more viable option for industrial applications.

Fiber coating chemical vapor deposition is attractive from an industry standpoint because it produces a fiber interface coating for ceramic matrix composites. These interface coatings make possible the desirable properties that make them potentially useful high-temperature structural materials. The present invention advances the state of the art in CVD fiber coating by making it repeatable, consistent and cost effective. As a practical matter, the present invention minimizes operator error, provides a record of any deviations in coating runs, and integrates all automation components using one computer.

SUMMARY OF THE INVENTION

The present invention provides a computer controlled fiber coating chemical vapor deposition system and method for generating substantially uniform coated fibers by maintaining chemical vapor deposition reactor temperature in real time. Reactor temperature is monitored by in situ temperature sensors. Reactor temperature is sensitive to oxygen levels and oxygen levels within the reactor are varied in response to temperature sensor data. Closed loop process control software maintains reactor temperature at a preselected value resulting in predictable fiber coatings of a preselected thickness, crystallinity and chemistry.

It is therefore an object of the invention to provide a fiber coating chemical vapor deposition system capable of consistently producing fiber coatings of a predictable composition.

It is another object of the invention to provide a computer automated fiber coating chemical vapor deposition system and process.

It is another object of the invention to provide a fiber coating chemical vapor deposition system employing in situ temperature sensors to monitor and maintain reactor temperature in real time.

It is another object of the invention to provide a fiber coating chemical vapor deposition system capable of varying oxygen flow within the reactor based on in situ temperature measurements to in turn maintain reactor temperature at a preselected value.

These and other objects of the invention are described in the description, claims and accompanying drawings and are achieved by a computer control, fiber coating chemical vapor deposition method for generating substantially uniform coated fibers comprising the steps of:

threading a thin-film interface coating receiving fiber through a hot-walled reactor chemical vapor deposition system;

computer controlled setting up and heating of an inert gas containing precursor material liquid delivery system, precursor material vaporizer and said hot-walled reactor;

maintaining a computer controlled pressure differential between precursor material and reacting gas entering said hot-walled reactor and exhaust gas exiting said hot-walled reactor, reactor gas flowing through said hot-walled reactor dependent on said pressure differential;

providing a flow maintaining temperature sensor within said hot-walled reactor, said temperature sensor communicating with a process control computer;

exposing said thin-film interface coating receiving fiber to an oxygen containing reacting gas atmosphere within said hot-walled reactor, a chemical reaction therebetween resulting in ceramic compound deposition on said thin-film interface coating receiving fiber;

process control computer comparing of data from said temperature sensor with a preselected setpoint temperature;

varying oxygen flow into said oxygen containing reacting gas atmosphere within said hot-walled reactor proportionate to a variance between data from said temperature sensor and said preselected setpoint temperature in said process control computer whereby said temperature in said hot-walled reactor chemical vapor deposition system increases with increased oxygen flow and decreases with decreased oxygen flow; and maintaining temperature within said hot-walled reactor chemical vapor deposition system by repeating said providing, exposing, process control computer comparing and varying steps.

DETAILED DESCRIPTION

The present invention helps solve problems in the chemical vapor deposition fiber coating art of poor coating uniformity, thickness, and chemistry control. The device and method of the invention allows an operator to employ a computer controlled CVD system which measures deposition parameters and exhaust gas composition in real time during the coating deposition thereby producing fibers with a more uniform coating composition and thickness.

A significant aspect of the invention is computer control of the CVD system including sensing and maintaining in situ temperature of the reactor of the CVD system. A constant, pre-selected in situ temperature produces a more uniform coating composition and thickness. In known prior art systems, in situ temperature is not monitored in real time.

The present invention varies and maintains in real time reactor temperature by varying oxygen flow rate within the CVD reactor. Reactor temperature is sensitive to variations in oxygen flow. In situ temperature measurements are collected within the CVD system, compared to a reference temperature, and the oxygen flow rate into the system is adjusted accordingly using closed loop process control. Maintaining a regulated temperature within the CVD fiber coating system by controlling oxygen flow within the system produces improved fiber coatings.

Figure 2:
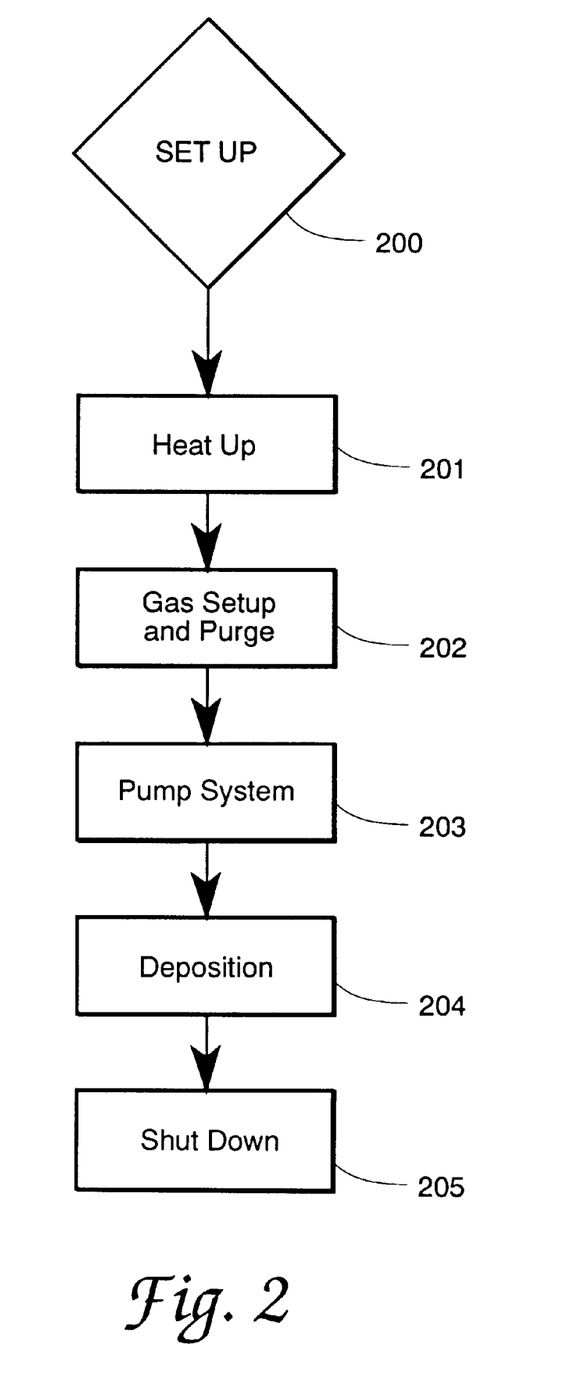
FIG. 2 shows a flow graph of the fiber chemical vapor deposition system according to the invention.
Figure 3:
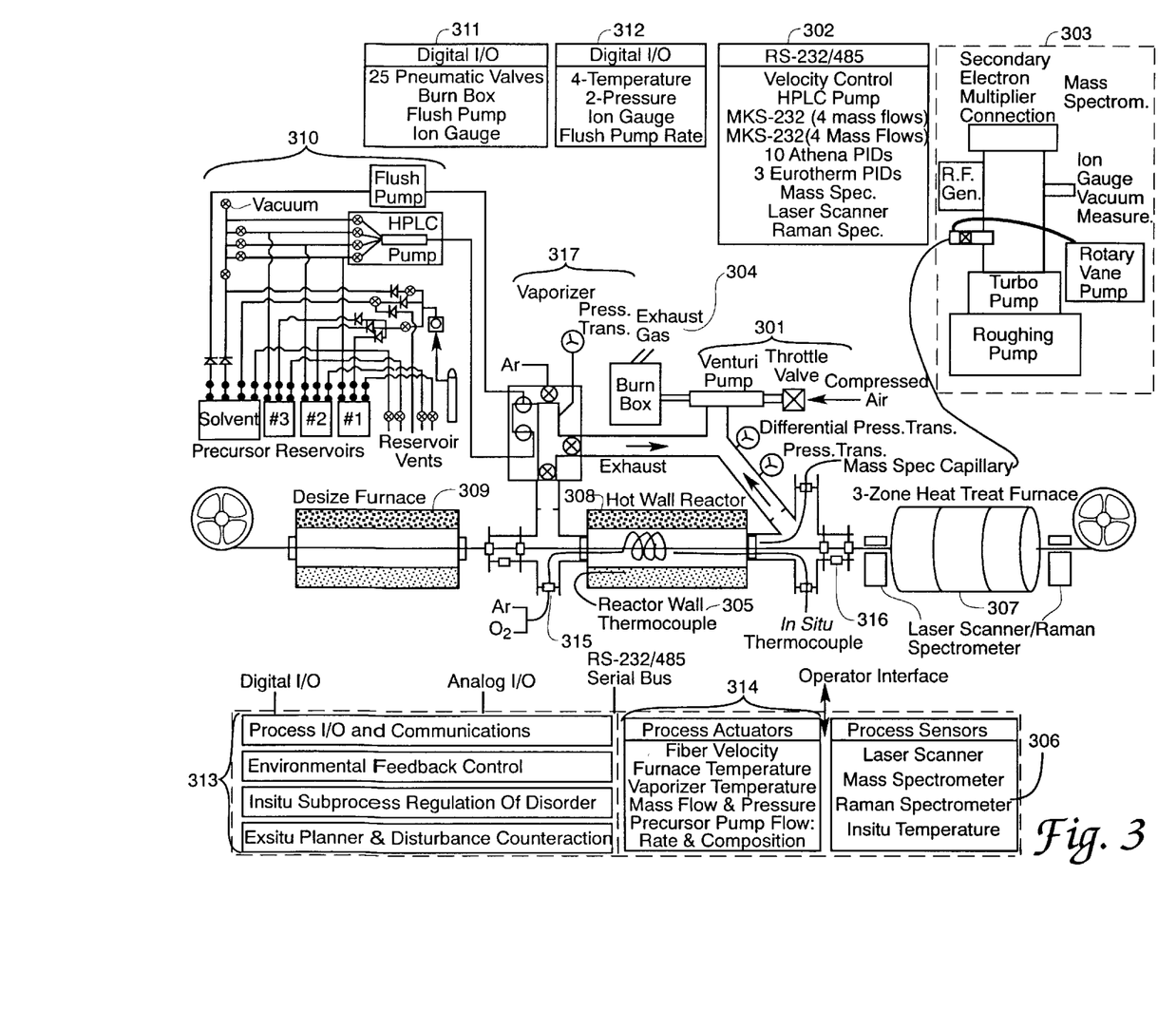
FIG. 3 shows a fiber chemical vapor deposition system according to the invention.

FIG. 2 shows a general flowgraph of the CVD fiber coating system according to the invention and FIG. 3 shows a hardware arrangement according to the invention. In the FIG. 3 arrangement of the invention, the system is automated using LabVIEW® 4.0 from National Instruments, a Power Macintosh 8100/100 computer system, an N400 expansion chassis from Second Wave Inc., two acquisition boards from National instruments, and two four-port serial interface cards from Applied Engineering, Inc. Building on these fundamental components, the entire CVD system is automated which allows in situ temperature sensing, corresponding control of oxygen flow and reactor temperature maintenance.

The system is first automatically set up, the set up step being represented at 200 in FIG. 2, by threading a fiber to be coated through the system, ensuring the availability and pressure of the gases argon and oxygen and actuation of a pneumatic air valve for pneumatic solenoids that control gas and liquid flow. A reel of fiber is represented at 318 in FIG. 3, the source of the precursor and reactant gases is shown at 317 and the digital I/O of the pneumatic valves is represented in box 311 in FIG. 3 A fiber may be threaded through a desize furnace to prepare and clean it for coating prior to threading it through the reactor. Additionally, after a fiber is coated in the reactor, it may be threaded through a 3-zone heat treat furnace to crystallize the coatings.

The second step of the computer controlled process is heatup, represented at 201 in FIG. 2, which includes computer controlled actuation of the heater setpoints to begin heating up the reactor, seals, inlets and outlet heater tapes. One possible arrangement includes a lanthanum methoxyethoxide, aluminum secbutoxide in an excess methoxyethanol delivery system. The system of the invention uses inert gas seals, shown at 315 and 316 in FIG. 3, which obviates the need for a sealed system. Flow of argon gas is initiated to the vaporizer, shown at 319 in FIG. 3, a minimum of 100 sccm, the vaporizer is heated up to 275 C, the 220V heater connected to the mass spectrometer capillary tube is turned on, and gas to the inlet and outlet seals is set to 100 sccm and 120 sccm, respectively. The system is then allowed to equilibrate over a two hour period.

The third step of the process is gas setup and purge, represented at 202 in FIG. 2, which includes turning on the gases to the desired flow rates, and setting the differential pressure setpoint. Gas flows are handled by seven mass-flow controllers, including five for Ar and two for $O_2$, serial bus mass flow process controllers represented at block 302 in FIG. 3. Of the Ar mass-flow controllers, one maintains a constant inert environment for the HPLC precursor pump, also represented in block 302, the second controls the carrier gas flow through the vaporizer 319, and the third controls the Ar process gas flow (used to dilute the $O_2$ process gas). The remaining two Ar controllers feed the gas seals at the system inlet 315 and outlet 316. The size of the seal orifices and the Ar flow are adjusted such that the seals are slightly pressurized. Ar from the seals is forced both into the reactor 308 and out of the system, ensuring that the ambient atmosphere is excluded from the system. The $O_2$ mass-flow controllers regulate the flow of $O_2$ to the in-line desize furnace and the $O_2$ process gas entering the reactor.

The reactor pressure is set and maintained slightly (~1 torr, typically) below atmospheric pressure through the use of a venturi pump system 301. Pressure control is obtained by regulating the amount of compressed air, shown at 320, allowed into the pump, which in turn controls the amount of effluent which is pulled through the pump. A differential pressure transducer at 321 with a 5 V range for a 10 torr span is used to precisely measure the difference between atmospheric pressure and the reactor exhaust pressure, and an MKS 250B pressure controller regulates the flow of compressed air through the venturi pump 301 via a throttle valve 322. The exhaust pressure can be held to within ±0.1 torr of the setpoint.

The fourth step of the computer controlled process involves operating the pump system, represented at 203 in FIG. 2 and shown at 310 in FIG. 3, including setting the HPLC pump, shown at 323, flow rate, setting fiber velocity, setting desired precursor ratios, making sure gas bottles are manually open at the plumbed lines, activating the exhaust burn box to burn off contaminants and initially pumping ethanol with a flush pump through the vaporizer just prior to pumping precursor material using the HPLC pump.

The fifth step of the computer controlled process is deposition, represented at 204 in FIG. 2. Operation of the CVD system of FIG. 3 includes passing materials from the liquid delivery pump system 310 through the vaporizer 317 then through the hot wall reactor 308 where the fiber coating occurs. The exhaust or effluent gas exits the hot wall reactor 308. If desired, the fiber can be threaded through the desizing furnace at 309 prior to the hot wall reactor or the fiber can be thread through the 3-Zone heat treat furnace 307 for further processing of the coated fiber.

The computer that controls the automated CVD process is shown generally at 313. The computer provides three distinct methods of interfacing with the components that comprise the system. As represented in block 311, digital input and output capability is available for the pneumatic values, the burn box, the flush pump and the ion gauge. As represented at block 312, analog input and output capability is available for temperature and pressure the ion gauge and the flush pump rate. Serial bus interface capability, represented at 302 is available for velocity control, the HPLC pump, 8 mass flow controllers, 10 Athena PIDs, 3 Eurotherm PIDs, the mass spectrometer, the laser scanner and the Raman Spectrometer.

The coating system chosen to describe the method and device of the present invention is a lanthanum hexaluminate ($LaAl_{11}O_{18}$) coating deposited on a sapphire fiber. This coating system is selected by way of example and is not intended to limit the use of the invention with other coating and fiber combinations. Lanthanum hexaluminate is one member of the β-alumina/magnetopiumbite family of compounds that has been identified as potentially valuable as interface coatings in CMCs. The coating is a complex (multi-cation) oxide and is useful in illustrating the sensor and control capabilities of the present invention.

Characterization of the coating material may be performed using a Raman spectrometer 306 in FIG. 3. In the FIG. 3 arrangement of the invention, the characterization is performed using an EIC fiber-optic Echelle Raman spectrograph with one wave number resolution and f1.8 collection optics. This instrument has a useable range of 250 to 3000 $cm^{-1}$ on the Stokes side of the 532 nm excitation wavelength. Using this instrument, a collected spectrum which has an acceptable signal-to-noise ratio (SNR) typically requires a 60 second collection time. Software from Galactic industries, GRAMS/386®, is used to process and analyze the collected spectra.

A significant aspect of the invention is maintaining reactor temperature by varying oxygen flow based on in situ temperature measurements. In situ measurements of the reactant gas stream within the reactor are made using a mass spectrometer system, shown at 303 in FIG. 3, at the exhaust of the reactor, and thermocouples inside the reactor tube. Three type-K thermocouples are located at selected locations within the reactor tube. Another type-K thermocouple, shown at 305, resides outside the tube and is used for furnace control. Each thermocouple inside the reactor is connected to a nonlinearized signal-conditioning module with a 10 V range for –100 to 1350° C. Each signal is acquired using 12 bit A/D conversion and linearized using a polynomial.

Figure 4:
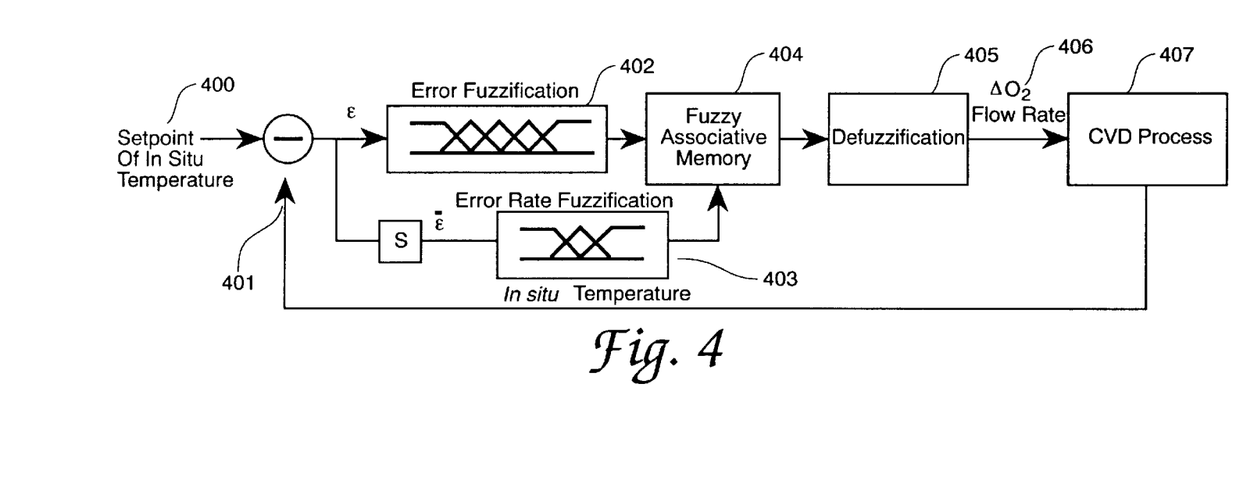
FIG. 4 shows a fuzzy controller block diagram according to the invention.

A fuzzy-logic based controller, shown in FIG. 4, operates to adjust the oxygen flow rate to regulate the in situ temperature. The fuzzy-logic based controller is represented at block 324 in FIG. 3, the "In situ subprocess regulation of disorder" and operates as a closed-loop system. The fuzzy controller of FIG. 4 has two inputs, an in situ temperature 401 and a setpoint of in situ temperature, 400. The fuzzy controller of FIG. 4 also uses error 402 and error rate 403 fuzzification. To generate a change in the in situ temperature requires a change in the output flow rate of oxygen command 406. Both the error and error-rate values are filtered using a 3rd-order Butterworth low-pass filter with a normalized cutoff of $\omega_n = 0.2$ prior to being converted to fuzzy membership values 402 and 403. Based on the fuzzy variables shown in Table 1, triangular membership functions were used for the fuzzification of both the error and error rate inputs, represented at 404 in FIG. 4. Fuzzification refers to the process of converting a numerical value into a degree of membership of each fuzzy variable which is defined by a fuzzy membership function.

Defuzzification, represented at 406 in FIG. 4, was accomplished through the use of a 3 by 5 fuzzy associative memory (FAM) rule-base, defining the output change of oxygen 406 in terms of five different fuzzy variables, as indicated in Table 1.

TABLE 1

Fuzzy variables for fuzzy associative memory

| Error | Error rate | Change in O2 flow rate |
|---|---|---|
| PL Positive Large | P Positive | PF Positive full |
| PS Positive small | Z Zero | PH Positive half |
| ZE Zero | N Negative | ZO Zero |
| NS Negative small | | NH Negative half |
| NL Negative large | | NF Negative full |

Figure 5:
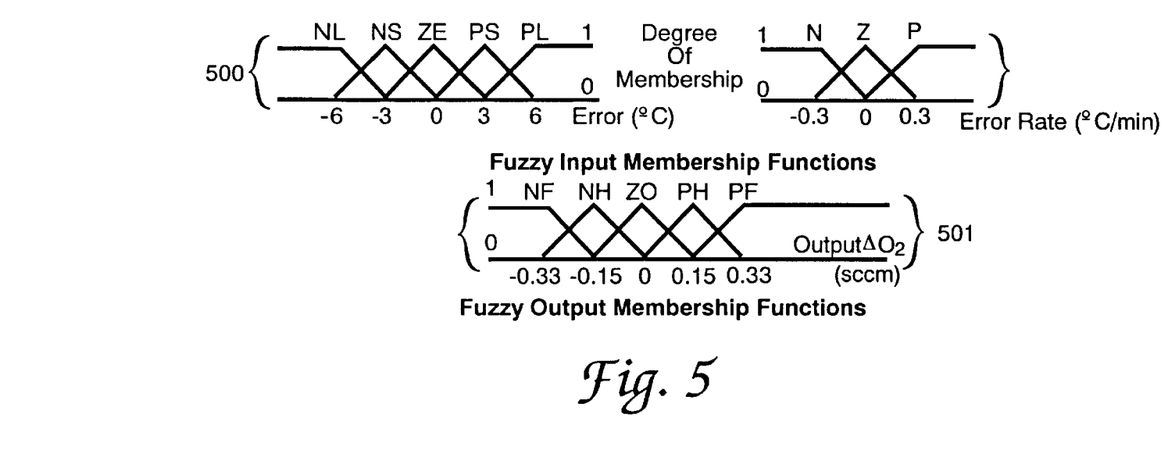
FIG. 5 shows fuzzy membership functions of the fuzzy controller of FIG. 4.

FIG. 5 shows the fuzzy membership functions of the fuzzy logic controller of FIG. 4. The degree of membership, shown at 500, of the input fuzzy sets which correspond to each FAM rule are combined in an AND fashion to produce the degree of clipping of each specified output fuzzy set shown at 501. In fuzzy logic an AND corresponds to taking the minimum value of the degree of membership of each corresponding fuzzy membership function. Fuzzy logic using triangular membership functions is used in the arrangement of the present invention to prescriptively define how the oxygen flow rate will be adjusted in a non-linear fashion based on the in situ temperature and its rate of change. Thus, the system response can be changed by changing the membership functions causing a faster or slower response with more or less precision, without having detailed knowledge of process control theory. Possible alternatives to fuzzy-based logic control include PID control, adaptive control and neural control.

Figure 6:
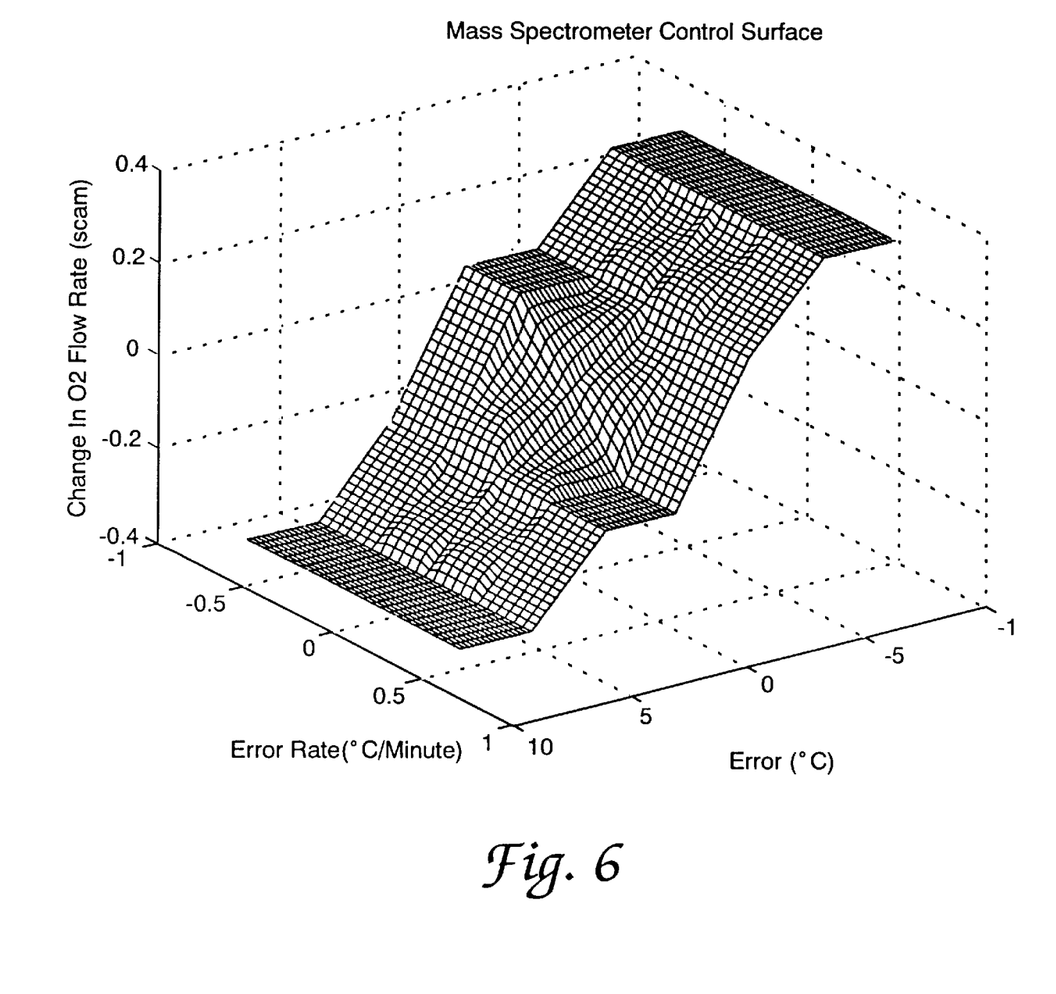
FIG. 6 shows a control surface of the fuzzy controller of FIG. 4.

FIG. 6 shows a control surface of the fuzzy controller of FIG. 5. The control surface graphically represents the oxygen flow rate change implemented by the computer software. The correlation-minimum inference method with centroid defuzzification was used to generate the output command. The control surface shown in FIG. 6 shows the output command change over the range of inputs for error and error rate. Using this method, the resulting output value is the center of gravity of the clipped output fuzzy sets. Letting $X_i$ and $Y_i$ correspond to the degree of membership of the FAM input fuzzy sets (the antecedents) and $Z_i$ correspond to the output fuzzy sets (the consequents), the output is calculated as:

$$O = \frac{\sum_{i=1}^{N\,Rules} Z_i \min(X_i, y_i)}{\sum_{i=1}^{N\,Rules} \min(X_i, Y_i)} \quad (1)$$

Figure 7:
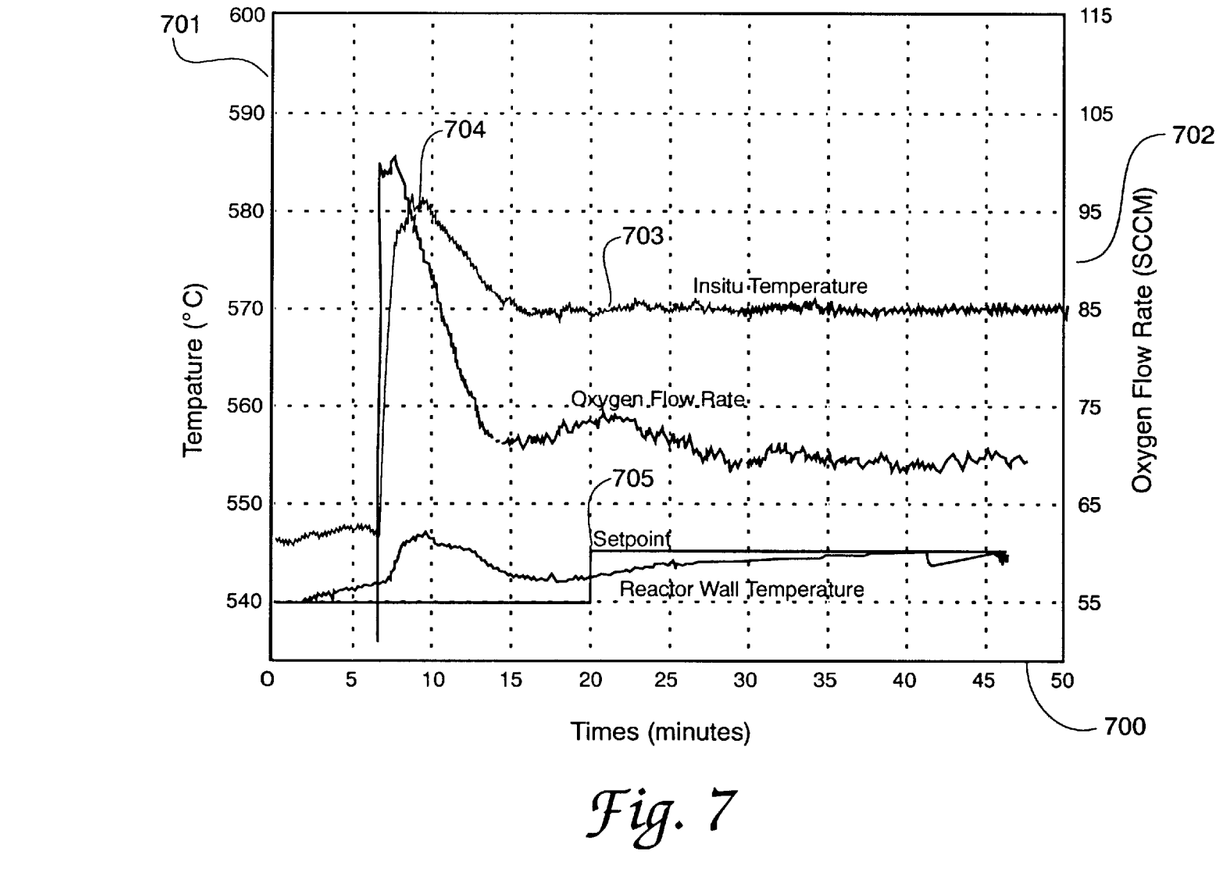
FIG. 7 shows reactor temperature resulting from deposition with the fuzzy controller of FIG. 4 according to the invention.
Figure 8:
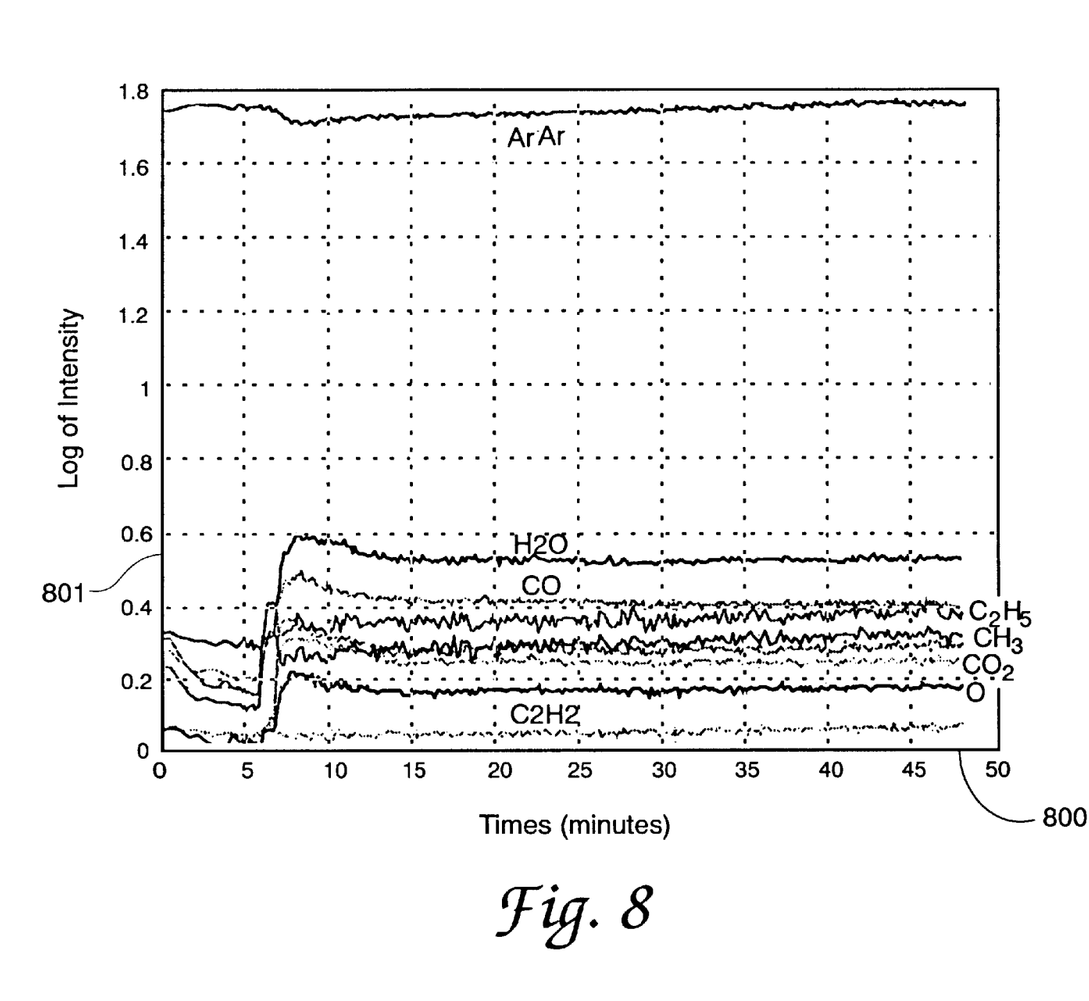
FIG. 8 shows mass spectra resulting from deposition with the fuzzy controller of FIG. 4.

FIGS. 7 and 8, respectively, show the temperature and mass spectra data collected over the course of one deposition of the computer controlled CVD system of the invention using the fuzzy control algorithm. In FIG. 7, time is represented on the horizontal axis, 700, temperature is represented on the left vertical axis, 701, and oxygen flow rate is represented on the right vertical axis, 702. The fuzzy controller was exercised to cause the in situ temperature to be regulated at 570° C., shown at 703 by automatically adjusting the oxygen flow into the reactor. Adding oxygen to the hydrocarbon-rich atmosphere in the reactor results in significant heat generation through oxidation reactions (combustion). In this arrangement of the invention, the in situ temperature is regulated using oxygen to within ±1.25° C. over 30 min. The initial response time of 8 min., shown at 704 in FIG. 7, could be improved by increasing the number of error and output fuzzy sets, and thus increasing the maximum step size above 0.4 SCCM/update. Even with the change of reactor wall setpoint (540 to 545° C.) at 20 min, shown at 705, the in situ temperature is maintained. FIG. 7, therefore shows that with the control system of the invention, there is minimal variation in reactor temperature over approximately a half-hour period.

Figure 9:
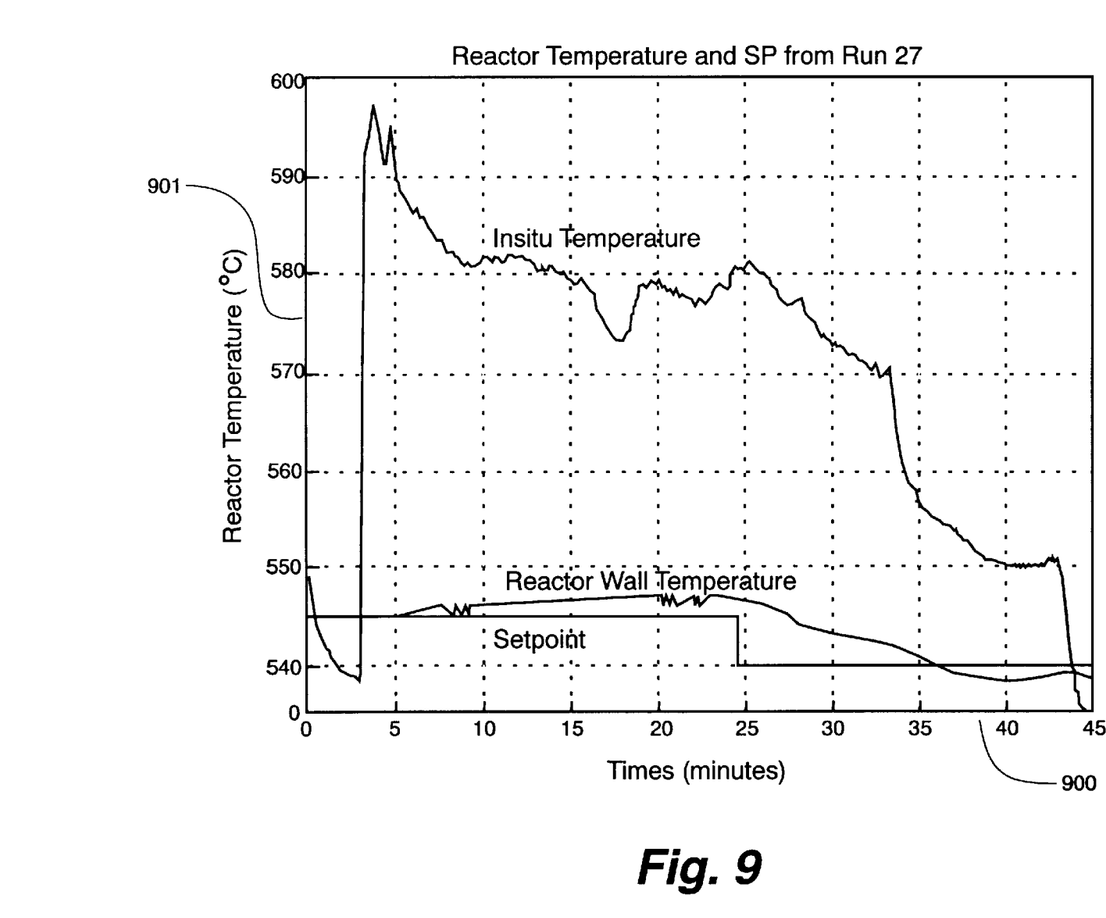
FIG. 9 shows reactor temperature during uncontrolled deposition.

By contrast, FIG. 9 shows reactor temperature during uncontrolled deposition of the prior art. Time is represented on the horizontal axis, 900, of the graph of FIG. 9 and reactor temperature is represented on the left horizontal axis, 901. FIG. 9 shows that the in situ temperature varies substantially with time due to the ebb and flow of exothermic oxidation reactions (combustion) occurring in the reactor (the reactor atmosphere is essentially a mixture of alcohol vapors and oxygen in excess Ar). This occurs despite the fact that the reactor wall temperature (the process variable) remained approximately at the setpoint. This deposition was performed under the same conditions as that utilizing the fuzzy logic controller, with the exception that the oxygen flow rate was set to 300 SCCM. Because deposition rate is extremely sensitive to temperature, it is desirable to keep the temperature precisely controlled.

FIG. 8 shows a graph of mass spectra resulting from deposition with the fuzzy controller. Time is represented on the horizontal axis, 800, and log of intensity is represented on the vertical axis, 801. FIG. 8 shows that the gas phase species remain essentially constant, with constant temperature. Thus, FIG. 8 shows that the byproducts of combustion from within the reactor are relatively constant over approximately a 40 minute period which indicates a uniform coating process within the reactor during the same period.

Figure 10:
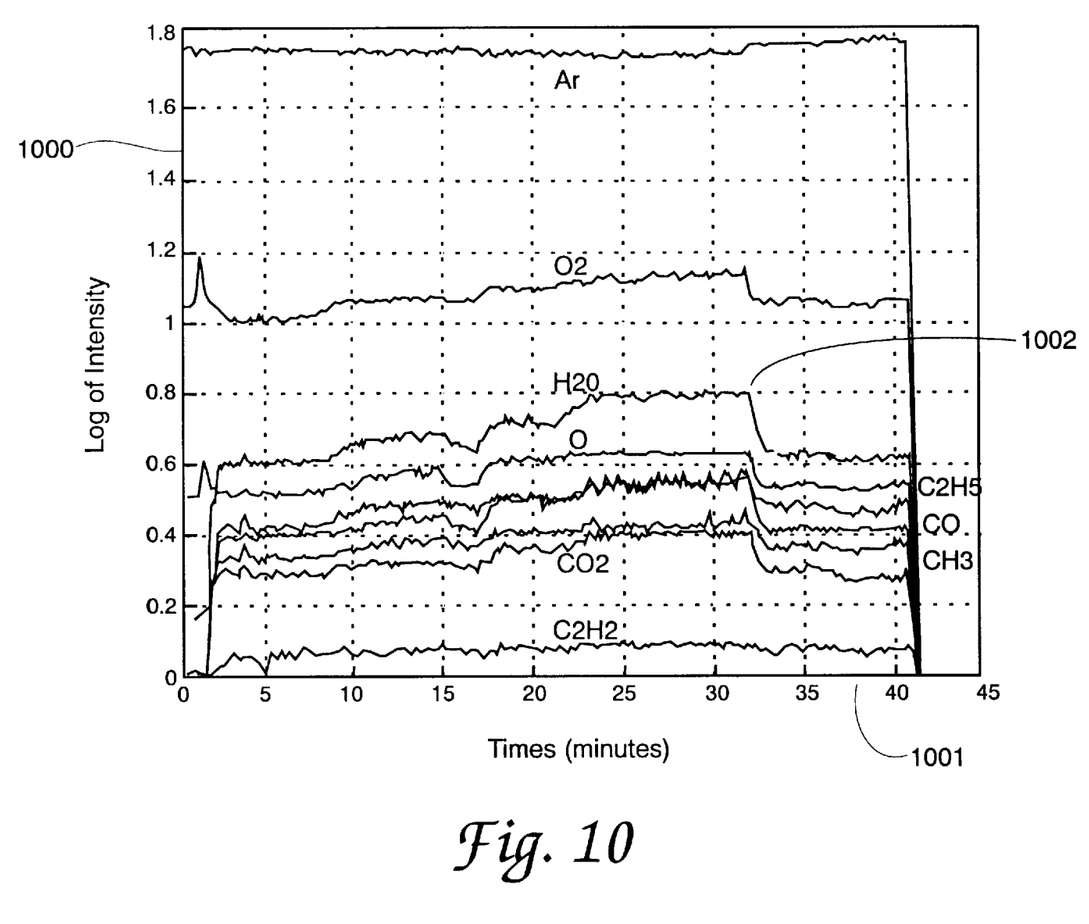
FIG. 10 shows mass spectra of exhaust during uncontrolled deposition.

In contrast, FIG. 10 shows mass spectra of exhaust during uncontrolled deposition with log of intensity on the left vertical axis 1000 and time on the horizontal axis 1001. FIG. 10 shows that there is a drift in the gas species, an example being shown at 1002, during uncontrolled deposition, which results in inconsistent coatings.

The exhaust gas from the CVD reactor, shown at 304 in FIG. 3, is analyzed using a Balzers QMS 420 mass spectrometer 303. It utilizes a non-discriminating gas inlet system which includes a 1 m long resistively heated 0.150 mm ID capillary tube which connects the reactor exhaust to a flange on the mass spectrometer vacuum column. This configuration results in a two-stage reduction of the pressure from atmospheric to $10^{-4}$ torr, with the partial pressure composition of the gas mixture remaining unchanged. The actual analysis is performed at high vacuum, typically $10^{-6}$ torr, using a quadrupole mass filter. The gas entering the mass spectrometer is ionized by an ion source, while the mass filter selects the appropriate mass ratio, which will be counted by the ion detector. Integration of the ion-detector signal provides a measure of ions detected, based on the ion current, and hence a relative intensity of each AMU. Spectrum analyses with a range of about 40 AMU's can be recorded at intervals as small as 5 seconds.

The sixth and final step of the computer controlled process is shutdown, represented at 205 in FIG. 2, which includes purging and cooling the vaporizer, setting heater setpoints to room temperature, turning off gas flows, exhaust burn box and bottle pressurization and stopping the spool fiber appropriately.

The present invention helps solve problems in the chemical vapor deposition fiber coating art of poor coating uniformity, thickness, and chemistry control. The present invention provides the capability to (1) automate the CVD fiber coating process via computer control/logging of all measurable parameters; (2) implement in situ sensors so as to measure coating or gas phase properties in real time; and (3) implement close-loop process control based on the sensor data, to produce coatings with improvided composition and desired thickness. The consistency and repeatability of fiber coating made possible by the in situ temperature control of CVD of the present invention makes CVD a more viable option for industrial applications. Significant aspects of the invention described herein are not restricted to CVD coating of fibers, but may be equally as effective for depositing layers on substrates using CVD.

Fiber coating chemical vapor deposition is attractive from an industry standpoint because it produces a fiber interface coating for ceramic matrix composites. These interface coatings make possible the desirable properties that make them potentially useful high-temperature structural materials. The present invention advances the state of the art in CVD fiber coating by making it repeatable, consistent and cost effective. As a practical matter, the present invention minimizes operator error, provides a record of any deviations in coating runs, and integrates all automation components using one computer.

While the apparatus and method herein described constitute a preferred embodiment of the invention, it is to be understood that the invention is not limited to this precise form of apparatus or method and that changes may be made therein without departing from the scope of the invention which is defined in the appended claims.

We claim:

1. A computer control, fiber coating chemical vapor deposition method for generating substantially uniform coated fibers comprising the steps of:

threading an interface coating receiving fiber through a hot-walled reactor chemical vapor deposition system;

computer controlled setting up and heating a lanthanum methoxyethoxide, aluminum sec-butoxide in an excess methoxyethanol delivery system, a precursor material vaporizor and said hot-walled reactor;

maintaining a computer controlled pressure differential between precursor material and reacting gas entering said hot-walled reactor and exhaust gas exiting said hot-walled reactor, reactor gas flowing through said hot-walled reactor dependent on said pressure differential;

providing a flow maintaining temperature sensor within said hot-walled reactor, said temperature sensor communicating with a process control computer;

exposing said interface coating receiving fiber to a reacting gas atmosphere containing oxygen and lanthanum methoxyethoxide, aluminum sec-butoxide in excess methoxyethanol within said hot-walled reactor, a chemical reaction therebetween resulting in ceramic compound deposition on said interface coating receiving fiber;

process control computer comparing of data from said temperature sensor with a preselected setpoint temperature;

varying oxygen flow into said oxygen containing reacting gas atmosphere within said hot-walled reactor proportionate to a variance between data from said temperature sensor and said preselected setpoint temperature in said process control computer whereby said temperature in said hot-walled reactor chemical vapor deposition system increases with increased oxygen flow and decreases with decreased oxygen flow; and maintaining temperature within said hot-walled reactor chemical vapor deposition system by repeating said providing, exposing, process control computer comparing and varying steps.

* * * * *